United States Patent
Kim

(10) Patent No.: US 9,112,437 B2
(45) Date of Patent: Aug. 18, 2015

(54) METHOD OF DETECTING DISCONNECTION STATE OF POWER CABLE IN INVERTER SYSTEM

(71) Applicant: LSIS CO., LTD., Anyang-si, Gyeonggi-do (KR)

(72) Inventor: Kwang Woon Kim, Anyang-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 168 days.

(21) Appl. No.: 13/868,940

(22) Filed: Apr. 23, 2013

(65) Prior Publication Data

US 2014/0015462 A1    Jan. 16, 2014

(30) Foreign Application Priority Data

Jul. 13, 2012  (KR) ................. 10-2012-0076683

(51) Int. Cl.
| | | |
|---|---|---|
| H02P 7/00 | (2006.01) | |
| H02P 3/02 | (2006.01) | |
| H02H 5/10 | (2006.01) | |
| H02H 7/122 | (2006.01) | |
| H02J 7/00 | (2006.01) | |

(52) U.S. Cl.
CPC .. *H02P 3/02* (2013.01); *H02H 5/10* (2013.01); *H02H 7/122* (2013.01); *H02J 7/0036* (2013.01)

(58) Field of Classification Search
CPC ... G01R 29/085; G01R 31/08; G01R 31/1272

USPC .................. 318/432; 324/543, 765.01
See application file for complete search history.

(56) References Cited

U.S. PATENT DOCUMENTS

| | | | | |
|---|---|---|---|---|
| 7,880,417 | B2 * | 2/2011 | Suzuki | 318/432 |
| 8,536,877 | B2 * | 9/2013 | Moon et al. | 324/543 |
| 2008/0309270 | A1 * | 12/2008 | Suzuki | 318/432 |
| 2014/0340097 | A1 * | 11/2014 | Choi | 324/543 |

FOREIGN PATENT DOCUMENTS

| | | |
|---|---|---|
| JP | 2002-175750 | 6/2002 |
| JP | 2007-202353 | 8/2007 |
| JP | 2012-065529 | 3/2012 |
| KR | 20020061680 A  * | 7/2002 |
| KR | 20090109373 | 10/2009 |
| KR | 100968350 | 7/2010 |
| KR | 101114375 | 2/2012 |

\* cited by examiner

*Primary Examiner* — Rina Duda
*Assistant Examiner* — Bickey Dhakal
(74) *Attorney, Agent, or Firm* — Lee, Hong, Degerman, Kang & Waimey

(57) ABSTRACT

Disclosed is a method of detecting the disconnection state of a power cable in an inverter system. The method includes detecting a battery voltage, detecting a DC-link voltage, detecting the disconnection state of the power cable based on a difference value between the detected battery voltage and the DC-link voltage, and stopping driving of a motor if the power cable is detected as being disconnected.

5 Claims, 6 Drawing Sheets

METHOD OF DETECTING DISCONNECTION STATE OF POWER CABLE IN INVERTER SYSTEM

CROSS-REFERENCE TO RELATED APPLICATIONS

The present application claims priority under 35 U.S.C. 119 and 35 U.S.C. 365 to Korean Patent Application No. 10-2012-0076683, filed on Jul. 13, 2012, which is hereby incorporated by reference in its entirety.

BACKGROUND

The embodiment relates to an inverter. In particular, the embodiment relates to a method of detecting a non-connection state of a high-voltage cable constituting an inverter.

An inverter system serving as a motor controller employed in an eco-friendly vehicle is an electric/electronic substrate assembly (ESA) to convert high-voltage DC power into AC power or DC power for the purpose of controlling a motor. The inverter system is a main component constituting an electric motor of a vehicle.

The above-described eco-friendly vehicle employs a permanent magnet motor as a driving unit. The motor applied to the eco-friendly vehicle while serving as the driving unit is driven by phase current transferred from the inverter, which converts DC voltage into 3-phase voltage, through the first high-voltage power cable according to a pulse width modulation (PWM) signal of a controller.

In addition, the inverter converts DC-link voltage, which is transferred through the second high-voltage power cable according to the switching operation of a main relay, into 3-phase voltage.

Accordingly, if one of the first power cable, which connects the inverter with the motor, or the second power cable, which connects the high-voltage battery with the inverter, is disconnected, the motor is not smoothly driven. In addition, high voltage/high current is induced to a system, so that the whole inverter system is broken down, which may cause a fatal problem.

FIG. 1 is a view showing a device of detecting the disconnection state of a power cable in an inverter system according to the related art.

Referring to FIG. 1, a device of detecting the disconnection state of the power cable according to the related art includes a power cable 10 and a disconnection detecting unit 20 connected with the power cable 10 to transmit a signal based on the disconnection state of the power cable 10 to the controller.

The disconnection detecting unit 20 is connected to the power cable 10 to transmit a digital signal based on the connection state of the power cable 10 to the controller.

In other words, according to the related art, a disconnection detecting unit for checking the disconnection state of the power cable 10 is installed on the power cable 10 in the form of a hardware separately provided from the power able 10, and the disconnection state of the power cable 10 is checked in real time by using a digital signal output from the disconnection detecting unit.

However, since the disconnection detecting unit for the power cable 10 detects the disconnection state of the power cable 10 in the form of a hardware, the above disconnection detection unit has limitations in terms of space as well as a price.

In addition, the above disconnection detecting unit of the power cable 10 may be erroneously operated due to external causes.

SUMMARY

The embodiment provides a method of detecting a disconnection state of a power cable in an inverter system, capable of detecting the disconnection state (non-connection state) of the power cable through software implementation without additional hardware equipment.

The embodiment provides a method of detecting the disconnection state of a power cable, capable of verifying the normal operating state of hardware equipment in a system having the hardware equipment that can detect the disconnection state of the power cable.

Meanwhile, the embodiments are not limited to the above object, and those skilled in the art can clearly understand other objects from following description.

According to the embodiment, there is provided a method of detecting a disconnection state of a power cable in an inverter system. The method includes detecting a battery voltage, detecting a DC-link voltage, detecting the disconnection state of the power cable based on a difference value between the detected battery voltage and the DC-link voltage, and stopping driving of a motor if the power cable is detected as being disconnected.

In addition, the detecting of the disconnection state of the power cable includes calculating the difference value between the battery voltage and the DC-link voltage, comparing the calculated difference value with a preset reference value, detecting the power cable as being disconnected if the difference value is greater than the preset reference value, and detecting the power cable as being normally connected if the difference value is less than the reference value.

In addition, the power cable is a DC-link power cable to supply DC power, which is charged in a battery, to an inverter.

Further, the method further includes determining a state of a main relay to control the DC power supplied to the inverter. The detecting of the disconnection state of the power cable is performed when the state of the main relay is determined as an on-state.

In addition, the stopping of the driving of the motor includes changing the state of the main relay to an off-state, and forcibly-discharging a capacitor included in the inverter.

In addition, the forcibly-discharging of the capacitor included in the inverter includes setting a q-axis current serving as a torque component current to 0, and applying a d-axis current serving as a magnetic flux component current in the motor.

Meanwhile, according to the embodiment, there is provided a method of detecting a disconnection state of a power cable in an inverter system. The method includes checking a driving speed of a motor, determining if the checked driving speed of the motor exceeds a reference speed, determining if a phase current instruction value to drive the motor is greater than a first reference value if the driving speed of the motor exceeds the reference speed, determining if an actual phase current applied to the motor is less than a second reference value if the phase current instruction value is greater than the first reference value, and stopping driving of the motor if the actual phase current is less than the second reference value.

In addition, the actual phase current is a current flowing through a 3-phase power cable to transfer a 3-phase AC power converted through an inverter to the motor.

In addition, the stopping of the driving of the motor includes determining the 3-phase power cable as being disconnected if the actual phase current is less than the second reference value, and stopping the driving of the motor as the 3-phase power cable is disconnected.

Further, the method further includes determining the 3-phase power cable as being normally connected if the actual phase current is greater than the second reference value such that a driving power is continuously supplied to the motor.

In addition, the stopping of the driving of the motor includes setting a q-axis current serving as a torque component current to 0, and applying a d-axis current serving as a magnetic flux component current in the motor such that a capacitor included in the inverter is forcibly discharged.

As described above, according to the embodiment, since the non-connection state of the power cable can be diagnosed through software implementation instead of a scheme of detecting the non-connection state of the power cable by installing hardware equipment on a power cable, which has been mainly used according to the related art, advantages can be made in terms of cost, and an erroneous operation, which may occur due to external causes, can be previously prevented.

DETAILED DESCRIPTION OF THE EMBODIMENTS

The principle of the embodiments will be described below. Therefore, although not specifically described and depicted in the specification, a person having the ordinary skill in the art may realize the principle of the embodiments and may invent various apparatuses within the concept and scope of the embodiments. Further, in principle, conditional terms and embodiments mentioned in the specification shall be obviously intended to understand the concept of the embodiments and may not limit the scope of the embodiments.

Further it shall be understood that all detailed descriptions, which teach a specific embodiment as well as a principle, an aspect and embodiments, are intended to include structural and functional equivalents. Further, it should be understood that the equivalents may include equivalents to be developed in the future as well as known equivalents and may include all devices invented for performing the same functions regardless of the structure thereof.

Figure 1:
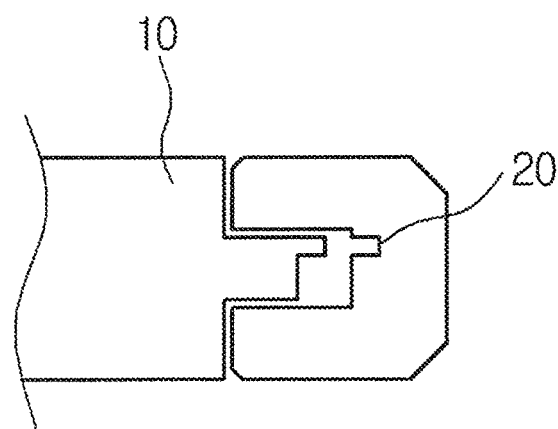
FIG. 1 is a view showing a device of detecting the disconnection state of a power cable in an inverter system according to the related art.
Figure 2:
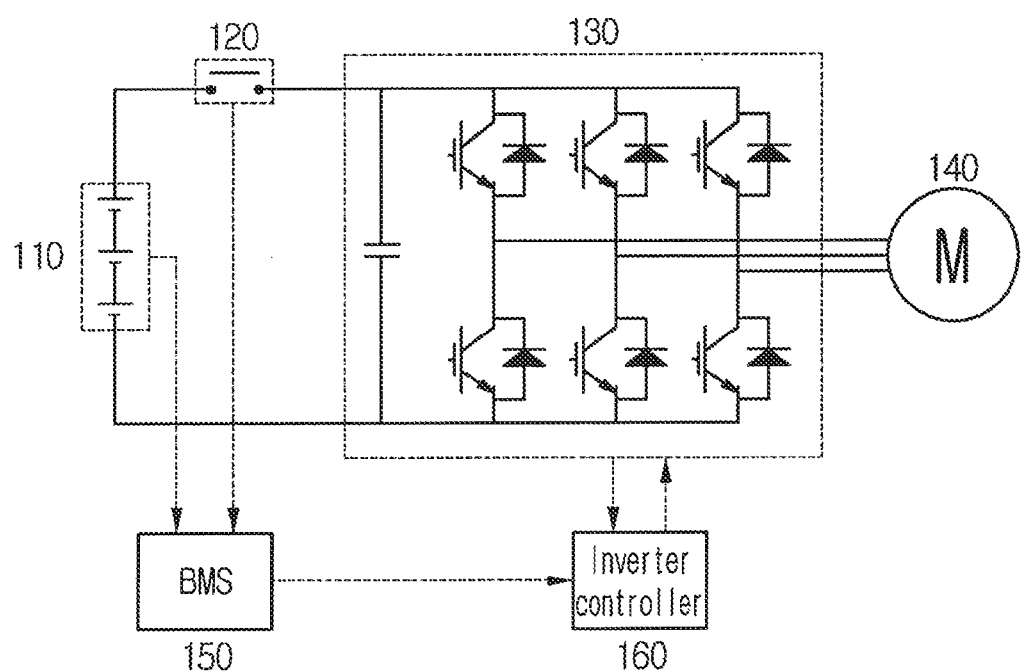
FIG. 2 is a circuit diagram showing the structure of an inverter system according to the embodiment.

FIG. 2 is a circuit diagram showing the structure of an inverter system 100 according to the embodiment.

Referring to FIG. 2, the inverter system 100 includes a battery 110, a main relay 120, an inverter 130, a motor 140, a battery management system (BMS) and an inverter controller 160.

The battery 110 supplies driving voltage to an electric vehicle (not shown).

In particular, the battery 110 supplies DC power to a capacitor C provided in the inverter 130 included in the inverter system 100.

The battery 110 is a high-voltage battery, and may include a plurality of unit cells.

The unit cells may be managed by the BMS 150 in order to maintain predetermined voltage. The battery 110 may discharge predetermined voltage under the control of the BMS 150.

For example, the BMS 150 detects the voltage of the battery 110 and transmits the detected voltage to the inverter controller 160.

In addition, if the voltage of the battery 110 is dropped to a predetermined lower limit value or less, the inverter controller 160 may supply to DC voltage, which is stored in capacitors provided in the electric vehicle, to the battery 110.

On the contrary, if the voltage of the battery 110 is increased to a predetermined upper limit value or more, the inverter controller 160 may supply the DC voltage, which is stored in the battery 110, to the capacitors of the electric vehicle.

Preferably, the battery 110 includes a rechargeable battery which may transit from a charging state to a discharging state according to the operating state thereof.

The main relay 120 is connected to a predetermined power line connected to the battery 100 to control the DC voltage output through the battery 110.

Although only one main relay connected to the power line is shown in accompanying drawings for the illustrative purpose, the number of the main relays may be increased.

For example, the main relay may include a first main relay connected to a positive terminal to control the DC voltage and a second main relay connected to a negative terminal to control the DC voltage.

The inverter 130 receives DC voltage from the battery 110 according to the switching state of the main relay 120.

In addition, the inverter 130 converts the DC voltage received therein from the battery 110 into AC voltage to be supplied to the motor 140.

The AC voltage converted by the inverter 130 is preferably a 3-phase AC voltage.

In particular, the inverter 130 includes an insulated gate bipolar transistor (IGBT) to perform a PWM (pulse width modulation) switching operation according to the control signal applied from the inverter controller 160, which is described later, thereby phase-transforming the voltage supplied from the battery 110 to drive the motor 140.

The motor 140 includes a stator (not shown), which is in a stationary state without rotation, and a rotor (not shown) rotating. The motor 140 receives AC voltage that is supplied through the inverter 130.

For example, the motor 140 may include a 3-phase motor. When voltage variable/frequency variable AC power is applied to a coil of a stator in each phase, the rotation speed of a rotor varies depending on the applied frequency.

The motor 140 may include various types of an induction motor, a blushless DC (BLDC) motor, and a reluctance motor.

Meanwhile, the motor 140 may be provided at one side thereof with a driving gear (not shown). The driving gear converts the rotational energy of the motor 140 according to a gear ratio. The rotational energy of the driving gear is transferred to a front wheel and/or a rear wheel so that the electric vehicle moves.

Meanwhile, although not shown, the electric vehicle may further include an electronic controller to control whole electronic devices of the electric vehicle. The electronic controller (not shown) controls the operation and the displaying of each device. The electronic controller (not shown) may control the BMS 150.

In addition, the electronic controller may generate a driving instruction value according to various operation modes (driving mode, rearward mode, neutral mode, and parking mode) based on detection signals transferred from an inclination angle detector (not shown) to detect the inclination angle of the electric vehicle, a speed detector (not shown) to detect the speed of the electric vehicle, a brake detector (not shown) according to the operation of a brake pedal, or an acceleration detector according to the operation of an acceleration pedal. In this case, for example, the driving instruction value may include a torque instruction value or a speed instruction value.

Meanwhile, the electric vehicle according to one embodiment may include a pure electric vehicle employing a battery and a motor, and a hybrid electric vehicle employing a battery and a motor together with an engine.

In this case, the hybrid electric vehicle may include a switching unit to select at least one of the battery and the engine, and a transmission. Meanwhile, the hybrid electric vehicle is classified into a series hybrid electric vehicle, which converts mechanical energy output from an engine into electrical energy to drive the motor, and a parallel hybrid electric vehicle which uses both of the mechanical energy output from the engine and the electrical energy output from the battery.

When the battery 110 includes a plurality of unit cells, the BMS 150 allows the unit cells to maintain predetermined voltage.

The BMS 150 discharges the voltage charged in the battery 110 to the inverter 130 through the main relay 120.

The inverter controller 160 controls the operation of the inverter 130.

For example, the inverter controller 160 calculates a driving value used to drive the motor 140 by using current (3-phase current) supplied to the motor 140, and generates a switching signal (PWM signal) used to control the inverter 130 based on the calculated driving value.

Accordingly, the inverter 130 is selectively turned on or turned off according to the switching signal generated through the inverter controller 160 to convert the DC power into AC power.

Meanwhile, the inverter controller 160 controls power supplied to the motor 140 by determining the state of a power cable through which the DC power or the AC power is supplied.

In this case, the power cable includes a first power cable through which the DC power is supplied, and a second power cable through which the AC power is supplied.

Figure 3:
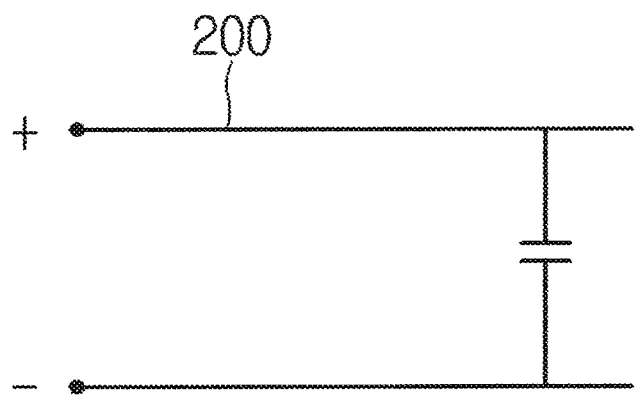
FIG. 3 is a circuit diagram showing the first power cable according to the embodiment.
Figure 4:
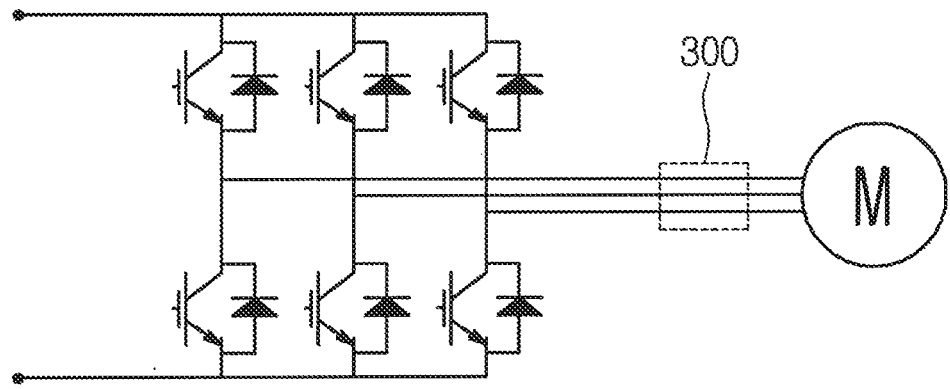
FIG. 4 is a circuit diagram showing the second power cable according to the embodiment.

FIG. 3 is a circuit diagram showing the first power cable according to the embodiment, and FIG. 4 is a circuit diagram showing the second power cable according to the embodiment.

Referring to FIG. 3, the inverter system 100 includes a first power cable 200 used to receive DC power (DC-link voltage) from the battery 110 and supply the DC power to the inverter 130.

The first power cable 200 are connected to positive (+) and negative (−) terminals of the battery 110, respectively, so that the DC power supplied through the battery 110 is supplied to the inverter 130.

In this case, if faults (for example, breaking, non-connection, or disconnection of a cable) occur in the first power cable 200, the inverter 130 does not receive normal DC power. Accordingly, problems may occur when driving the motor 140.

Accordingly, the inverter controller 160 detects a disconnection state of the first power cable 200. If the first power cable 200 is detected as being separated, the inverter controller 160 cuts off power to be supplied to the inverter 130 and the motor 140

A method of detecting the disconnection state of the first power cable 200 to cut off power will be described in more detail below.

Referring to FIG. 4, the inverter system 100 includes a second power cable 300 used to supply AC power converted through the inverter 130 to the motor 140.

In other words, the inverter 130 supplies 3-phase AC power converted through the second power cable 300 (i.e., 3-phase cable) to the motor 140.

The second power cable 300 may be divided into three individual cables. Alternately, three cables may be provided in one cable.

In addition, if faults (breaking, disconnection, or non-connection) occur in the second power cable 300 similarly to the first power cable 200, the 3-phase AC power converted through the inverter 130 is not normally supplied to the motor 140, so that serious problems may be caused when driving the electric vehicle.

Therefore, the inverter controller 160 detects the disconnection state of the second power cable 300. If the second power cable 300 is detected as being disconnected, the inverter controller 160 cuts off power to be supplied to the motor 140.

Hereinafter, a method of detecting the disconnection state of the first and second power cables 200 and 300, and the operation of the inverter system 100 according to the separation detection will be more described in more detail.

Figure 5:
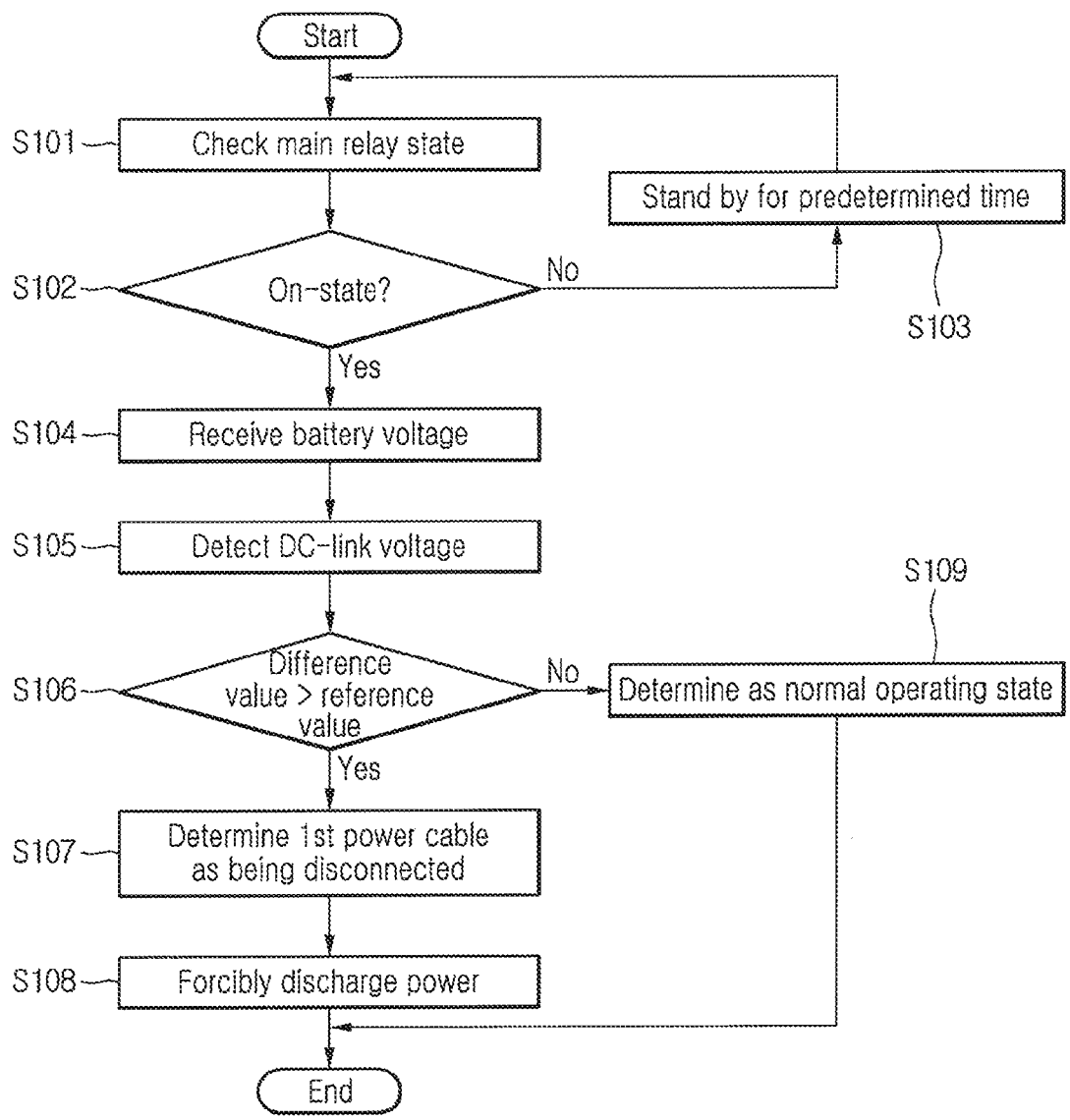
FIG. 5 is a flowchart showing the method of detecting the disconnection state of the first power cable according to the embodiment.

FIG. 5 is a flowchart showing the method of detecting the separation state of the first power cable 200 according to the embodiment.

Referring to FIG. 5, the BMS 150 detects the state of the main relay 120 (step S101).

In other words, the BMS 150 determines whether the electric vehicle is currently driven so that the DC power stored in the battery 110 is supplied to the inverter 130, or the driving of the electric vehicle is stopped, so that the DC power is not supplied to the inverter 130.

Thereafter, the BMS 150 determines if the main relay 120 is turned on (step S102).

If the main relay 120 is turned on according to the determination result (step S102), the BMS 150 checks the voltage of the battery 110 (step S104).

In other words, the BMS 150 checks the voltage (e.g., the rated voltage of the battery 110 or the output voltage of the battery 110) output from the battery 110 if the main relay 120 is turned on.

Thereafter, the BMS 150 detects voltage (DC-link voltage) supplied to the inverter 130 through the first power cable 200 (step S105).

Thereafter, if the battery voltage and the DC-link voltage are detected, the BMS 150 transfers the detected battery voltage and the DC-link voltage to the inverter controller 160.

The inverter controller 160 detects the difference between the battery voltage and the DC-link voltage, which are received therein from the BMS 150, and determines if the detected difference is greater than a preset reference value (step S106).

In other words, if the first power cable 200 has a normal connection state, the battery voltage must be equal to the DC-link voltage.

However, if the first power cable 200 has an abnormal connection state (breaking, non-connection, or disconnection), the difference is made between the battery voltage and the DC-link voltage.

In this case, a detection error may occur in the process of detecting the DC-link voltage, so that the DC-link voltage actually flowing through the first power cable 200 may differ from the detected DC-link voltage.

Accordingly, the error margin based on the detection error is set to the reference value, and, thus, a determination is made regarding if the difference between the battery voltage and the DC-link voltage is greater than the reference voltage.

If the difference between the battery voltage and the DC-link voltage is greater than the reference value according to the determination result (step S106), the inverter controller 160 determines the first power cable 200 as being abnormally connected currently (step S107).

In other words, if the difference between the battery voltage and the DC-link voltage is less than the reference value, the inverter controller 160 recognizes the difference between the battery voltage and the DC-link voltage as being made due to the detection error occurring in the process of detecting the DC-link voltage.

However, if the difference between the battery voltage and the DC-link voltage is greater than the reference value, the inverter controller 160 recognizes that the difference is made due to the abnormal connection of the first power cable 200 instead of the detection error.

Thereafter, the inverter controller 160 forcibly discharges power (step S108).

In this case, the forcibly discharging refers to that the inverter controller 160 forcibly discharges power stored in the capacitor (DC capacitor) included in the inverter 130.

To this end, the inverter controller 160 turns off the main relay 120. In other words, the inverter controller 160 prevents the power of the battery 110 from being supplied to the inverter 130 as the first power cable 200 is disconnected.

Thereafter, the inverter controller 160 forcibly discharges the power previously charged in the capacitor by the power supplied to the battery 110.

To this end, the inverter controller 160 discharges voltage remaining in the capacitor by controlling the motor 140 so that q-axis current serving as torque component current is set to 0, and only d-axis current serving as magnetic flux component current is applied in the motor 140.

As described above, if the main relay 120 is turned on, the inverter controller 160 activates the process of detecting the disconnection state of the first power cable 200.

Thereafter, the inverter controller 160 compares the battery voltage with the DC-link voltage. If the error margin is greater than or equal to the preset reference value according to the comparison result, the inverter controller 160 determines the first power cable 200 as being disconnected so that the forcibly discharging is performed as described above.

Meanwhile, if the difference between the battery voltage and the DC-link voltage is less than the reference value according to the determination result (step S106), the inverter controller 160 determines the first power cable 200 as being normally connected currently.

Figure 6:
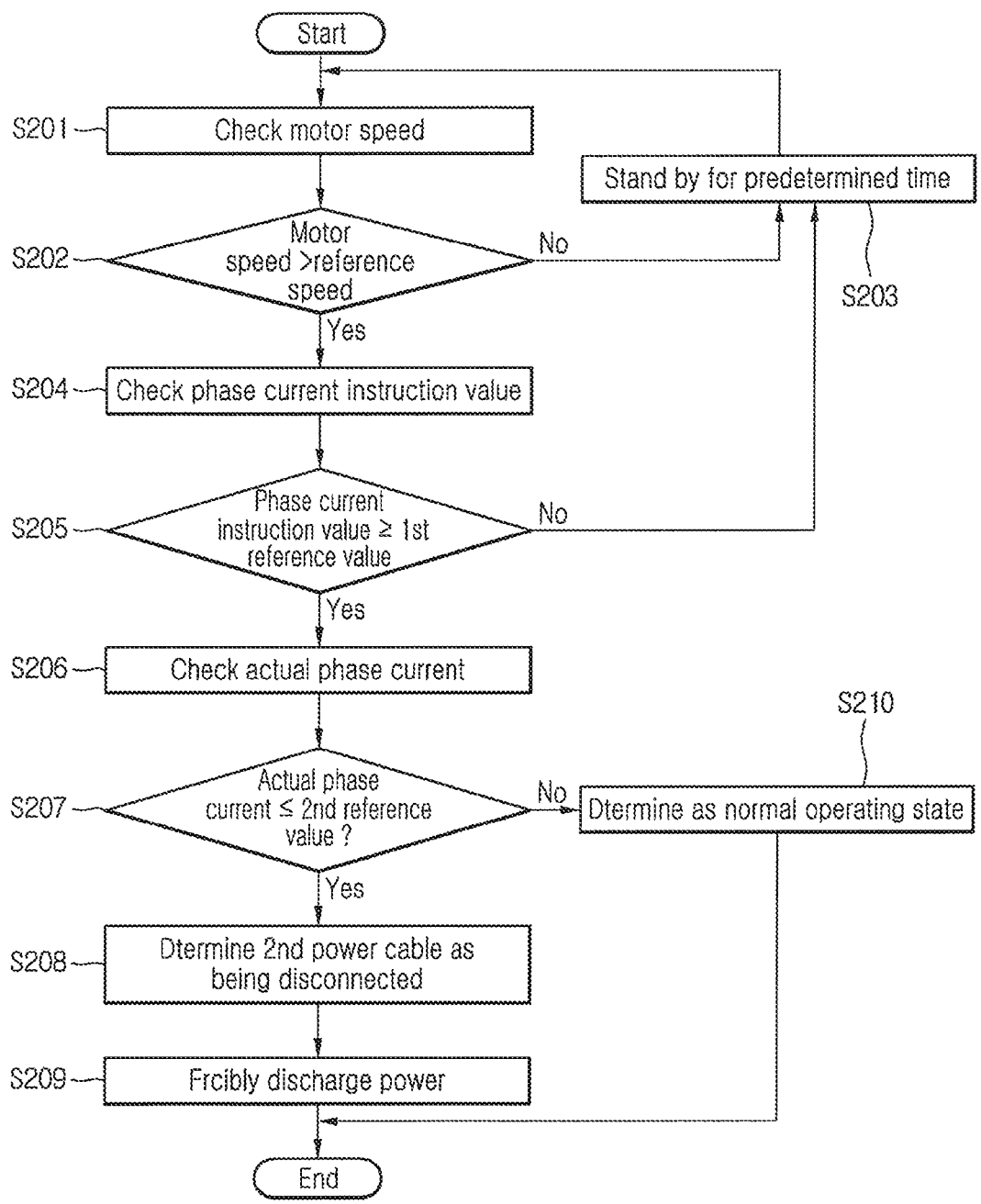
FIG. 6 is a flowchart showing the method of detecting the disconnection state of the second power cable step by step according to the embodiment.

FIG. 6 is a flowchart showing the method of detecting the disconnection state of the second power cable 300 step by step according to the embodiment.

Referring to FIG. 6, the inverter controller 160 checks the speed of the motor 140 (step S201).

The speed of the motor 140 is determined depending on frequencies. If the frequency of the motor 140 approximates zero, current in one phase of 3-phase current applied to the motor 140 fluctuates within the range approximating zero.

Accordingly, the inverter controller 160 detects the disconnection state of the second power cable 300 only if the speed of the motor 140 is greater than or equal to a predetermined speed.

The inverter controller 160 determines if the checked speed of the motor 140 exceeds a reference speed serving as a condition for detecting the disconnection state of the second power cable 300 (step S202).

If the speed of the motor 140 is equal to or less than the reference speed according to the determination result (step S202), the inverter controller 160 is in a standby state for a predetermined time (step S203) and then returns to step S201.

In addition, if the speed of the motor 140 exceeds the reference speed according to the determination result (step S202), an instruction value for phase current to be applied to the motor 140 is checked (step S204).

Thereafter, the inverter controller 160 compares the checked phase current instruction value with a preset first reference value (step S205).

The first reference value refers to a theoretical current instruction value corresponding to the torque instruction. Actually, the first reference value may be 50% of the theoretical current instruction value.

If the phase current instruction value is equal to or less than the first reference value according to the comparison result (step S205), the inverter controller 160 returns to the step S203 to be in the standby state until a time point at which the phase current instruction value is equal to or greater than the first reference value.

In addition, if the phase current instruction value is equal to or greater than the first reference value according to the comparison result (step S205), the inverter controller 160 detects actual phase current flowing through the second power cable 300 (step S206).

Thereafter, the inverter controller 160 determines if the detected actual phase current is equal to or less than the second reference value (step S207).

In this case, the second reference value may approximate zero. Preferably, when an error margin is allowed, the second reference value may be a value greater than zero by the error margin.

In other words, if the second power cable 300 is abnormally connected, the actual phase current becomes zero. In this case, even though the second power cable 300 is abnormally connected, the actual phase current is slightly greater than zero due to residual current remaining in the second power cable 300.

Accordingly, the inverter controller 160 allows the error margin so that the second reference value is set to a value greater than zero while approximating zero.

If the actual phase current is equal to or less than the second reference value according to the determination result (step S207), the inverter controller 160 determines the second power cable 300 as being abnormally connected currently (step S208).

Then, the inverter controller 160 performs the forcibly-discharging operation.

The forcibly-discharging operation refers to that the power stored in the capacitor (DC-capacitor) included in the inverter 130 is forcibly discharged.

To this end, the inverter controller 160 turns off the main relay 120. In other words, the inverter controller 160 prevents the power from being supplied from the battery 110 to the inverter 130 as the second power cable 300 is disconnected.

Thereafter, the inverter controller 160 forcibly discharges power which is previously charged in the capacitor by the power supplied to the battery 110.

To this end, the inverter controller 160 discharges voltage remaining in the capacitor by controlling the motor 140 so that q-axis current serving as torque component current is set to 0, and only d-axis current serving as magnetic flux component current is applied in the motor 140.

Meanwhile, if the actual phase current is greater than the second reference value according to the determination result (step S207), the inverter controller 160 determines the second power cable 300 as being in a normal operation state that the second power cable 300 is normally connected (step S210).

As described above, according to the embodiment, the non-connection state of the power cable can be diagnosed through software implementation instead of a scheme of detecting the non-connection state of the power cable by installing hardware equipment on a power cable, which has been mainly used according to the related art. Accordingly, advantages can be made in terms of cost, and an erroneous operation, which may occur due to external causes, can be previously prevented.

The above image processing method according to the embodiment may be prepared as a program for executing the method in the computer to be stored in the computer-readable recording medium and examples of the computer-readable recording medium include a ROM, a RAM, a CD-ROM, a magnetic tape, a floppy disk, an optical data storage, and the like and in addition, include a type of a carrier wave (e.g., transmission through the Internet).

The computer-readable recording media are distributed on computer systems connected through the network, and thus the computer-readable recording media may be stored and executed as the computer-readable code by a distribution scheme. In addition, functional programs, codes, and code segments for implementing the method can be easily deduced by programmer skilled in the art.

Further, as described above, although various examples have been illustrated and described, the present disclosure is not limited to the above-mentioned examples and various modifications can be made by those skilled in the art without departing from the scope of the appended claims. In addition, these modified examples should not be appreciated separately from technical spirits or prospects.

What is claimed is:

1. A method of detecting disconnection of a power cable in an inverter system, the method comprising:
   driving of a motor;
   determining if a driving speed of the motor exceeds a reference speed;
   determining if a phase current instruction value to drive the motor is greater than a first reference value if the driving speed of the motor exceeds the reference speed; determining if an actual phase current applied to the motor is less than a second reference value if the phase current instruction value is greater than the first reference value; and
   turning off a main relay if the actual phase current is less than the second reference value and no longer driving the motor,
   wherein the first reference value is set to 50% of a theoretical current instruction value corresponding to a torque instruction; and
   wherein the second reference value is set to a value greater then zero.

2. The method of claim 1, wherein the actual phase current is current flowing through a 3-phase power cable to transfer 3-phase AC power converted via an inverter to the motor.

3. The method of claim 2, wherein no longer driving the motor comprises:
   determining that the 3-phase power cable is disconnected if the actual phase current is less than the second reference value.

4. The method of claim 2, further comprising:
   determining that the 3-phase power cable is connected normally if the actual phase current is greater than the second reference value; and
   continuously supplying driving power to the motor.

5. The method of claim 3, wherein no longer driving the motor comprises:
   setting a q-axis current serving as a torque component current to 0; and
   applying a d-axis current serving as a magnetic flux component current in the motor such that a capacitor included in the inverter is forcibly discharged.

* * * * *